US008093983B2

(12) United States Patent
Fouquet et al.

(10) Patent No.: US 8,093,983 B2
(45) Date of Patent: Jan. 10, 2012

(54) NARROWBODY COIL ISOLATOR

(75) Inventors: Julie Fouquet, Portola Valley, CA (US);
Dominique Ho, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 86 days.

(21) Appl. No.: 12/751,971

(22) Filed: Mar. 31, 2010

(65) Prior Publication Data

US 2010/0188182 A1 Jul. 29, 2010

Related U.S. Application Data

(63) Continuation-in-part of application No. 11/512,034, filed on Aug. 28, 2006, now Pat. No. 7,791,900, and a continuation-in-part of application No. 12/059,747, filed on Mar. 31, 2008, now Pat. No. 7,852,186, and a continuation-in-part of application No. 12/059,979, filed on Mar. 31, 2008, and a continuation-in-part of application No. 12/370,208, filed on Feb. 12, 2009, and a continuation-in-part of application No. 12/392,978, filed on Feb. 25, 2009, now Pat. No. 7,741,943, and a continuation-in-part of application No. 12/393,596, filed on Feb. 26, 2009, and a continuation-in-part of application No. 12/477,078, filed on Jun. 2, 2009, and a continuation-in-part of application No. 12/495,733, filed on Jun. 30, 2009, now Pat. No. 7,948,067.

(51) Int. Cl.
*H01L 23/50* (2006.01)
*H01L 21/00* (2006.01)
*H01F 5/04* (2006.01)

(52) U.S. Cl. ........ 336/200; 336/232; 257/676; 257/692; 257/725; 257/E25.03; 257/E23.011; 257/E23.079; 257/E23.043; 257/E23.052; 257/E21.499; 438/123

(58) Field of Classification Search .................. 336/200, 336/232; 257/531, 676, 692, 725, E23.011, 257/E23.043, E23.052, E23.079; 438/123
See application file for complete search history.

(56) References Cited

U.S. PATENT DOCUMENTS

| 4,027,152 A | 5/1977 | Brown et al. |
| 4,494,100 A | 1/1985 | Stengel et al. |
| 4,541,894 A | 9/1985 | Cassat |
| 4,931,075 A | 6/1990 | Kuhn |
| 5,070,317 A | 12/1991 | Bhagat |
| 5,312,674 A | 5/1994 | Haertling et al. |
| 5,363,081 A | 11/1994 | Bando et al. |
| 5,420,558 A | 5/1995 | Ito et al. |

(Continued)

FOREIGN PATENT DOCUMENTS

CN 1180277 6/1996

(Continued)

OTHER PUBLICATIONS

Chip-Size Magnetic Sensor Arrays, Dr. Carl H. Smith and Robert W. Schneider, date unknown.

(Continued)

*Primary Examiner* — Evan Pert

(57) ABSTRACT

Disclosed herein are various embodiments of narrowbody coil isolators containing multiple coil transducers, where integrated circuits are not stacked vertically over the coil transducers. The disclosed coil isolators provide high voltage isolation and high voltage breakdown performance characteristics in small packages that provide a high degree of functionality at a low price.

41 Claims, 10 Drawing Sheets

U.S. PATENT DOCUMENTS

| | | | |
|---|---|---|---|
| 5,597,979 | A | 1/1997 | Courtney et al. |
| 5,659,462 | A | 8/1997 | Chen et al. |
| 5,693,971 | A | 12/1997 | Gonzalez |
| 5,716,713 | A | 2/1998 | Zsamboky et al. |
| 5,754,088 | A | 5/1998 | Fletcher et al. |
| 5,825,259 | A | 10/1998 | Harpham |
| 5,945,728 | A * | 8/1999 | Dobkin et al. ............... 257/666 |
| 5,952,849 | A | 9/1999 | Haigh |
| 6,167,475 | A | 12/2000 | Carr |
| 6,175,293 | B1 | 1/2001 | Hasegawa et al. |
| 6,198,374 | B1 | 3/2001 | Abel |
| 6,215,377 | B1 | 4/2001 | Douriet et al. |
| 6,255,714 | B1 | 7/2001 | Kossives et al. |
| 6,307,457 | B1 | 10/2001 | Wissink et al. |
| 6,320,532 | B1 | 11/2001 | Diede |
| 6,404,317 | B1 | 6/2002 | Mizoguchi et al. |
| 6,476,704 | B2 | 11/2002 | Goff |
| 6,489,850 | B2 | 12/2002 | Heineke et al. |
| 6,501,364 | B1 | 12/2002 | Hui et al. |
| 6,525,566 | B2 | 2/2003 | Haigh et al. |
| 6,538,313 | B1 | 3/2003 | Smith |
| 6,574,091 | B2 | 6/2003 | Heineke et al. |
| 6,661,079 | B1 | 12/2003 | Bikulcius et al. |
| 6,686,825 | B2 | 2/2004 | Tamezawa et al. |
| 6,856,226 | B2 | 2/2005 | Gardner |
| 6,859,130 | B2 | 2/2005 | Nakashima et al. |
| 6,867,678 | B2 | 3/2005 | Yang |
| 6,870,456 | B2 | 3/2005 | Gardner |
| 6,873,065 | B2 | 3/2005 | Haigh et al. |
| 6,888,438 | B2 | 5/2005 | Hui et al. |
| 6,891,461 | B2 | 5/2005 | Gardner |
| 6,903,578 | B2 | 6/2005 | Haigh et al. |
| 6,919,775 | B2 | 7/2005 | Wendt et al. |
| 6,922,080 | B2 | 7/2005 | Haigh et al. |
| 6,943,658 | B2 | 9/2005 | Gardner |
| 6,944,009 | B2 | 9/2005 | Nguyen et al. |
| 7,064,442 | B1 * | 6/2006 | Lane et al. ............... 257/773 |
| 7,170,807 | B2 | 1/2007 | Fazan et al. |
| 7,171,739 | B2 | 2/2007 | Yang et al. |
| 7,302,247 | B2 * | 11/2007 | Dupuis ............... 455/280 |
| 7,421,028 | B2 * | 9/2008 | Dupuis ............... 375/258 |
| 7,425,787 | B2 | 9/2008 | Larson, III |
| 7,436,282 | B2 | 10/2008 | Whittaker et al. |
| 7,447,492 | B2 * | 11/2008 | Dupuis ............... 455/333 |
| 7,460,604 | B2 | 12/2008 | Dupuis |
| 7,468,547 | B2 * | 12/2008 | Harvey ............... 257/666 |
| 7,791,900 | B2 * | 9/2010 | Fouquet et al. ............... 361/803 |
| 7,821,428 | B2 * | 10/2010 | Leung et al. ............... 341/101 |
| 7,852,186 | B2 * | 12/2010 | Fouquet et al. ............... 336/200 |
| 7,902,665 | B2 * | 3/2011 | Pruitt ............... 257/725 |
| 7,948,067 | B2 * | 5/2011 | Fouquet et al. ............... 257/666 |
| 2002/0075116 | A1 | 6/2002 | Peels et al. |
| 2002/0110013 | A1 | 8/2002 | Park et al. |
| 2002/0135236 | A1 | 9/2002 | Haigh |
| 2003/0042571 | A1 | 3/2003 | Chen et al. |
| 2004/0056749 | A1 | 3/2004 | Kahlmann et al. |
| 2005/0003199 | A1 | 1/2005 | Takaya et al. |
| 2005/0057277 | A1 | 3/2005 | Chen et al. |
| 2005/0077993 | A1 | 4/2005 | Kanno et al. |
| 2005/0094302 | A1 | 5/2005 | Matsuzaki et al. |
| 2005/0128038 | A1 | 6/2005 | Hyvonen |
| 2005/0133249 | A1 | 6/2005 | Fujii |
| 2005/0269657 | A1 | 12/2005 | Dupuis |
| 2005/0272378 | A1 | 12/2005 | Dupuis |
| 2006/0028313 | A1 | 2/2006 | Strzalkowski et al. |
| 2006/0095639 | A1 | 5/2006 | Guenin et al. |
| 2006/0152322 | A1 | 7/2006 | Whittaker et al. |
| 2006/0170527 | A1 | 8/2006 | Braunisch |
| 2006/0176137 | A1 | 8/2006 | Sato et al. |
| 2006/0214759 | A1 | 9/2006 | Kawarai |
| 2006/0220775 | A1 | 10/2006 | Ishikawa |
| 2007/0085447 | A1 | 4/2007 | Larson, III |
| 2007/0085632 | A1 | 4/2007 | Larson, III et al. |
| 2007/0086274 | A1 | 4/2007 | Nishimura et al. |
| 2007/0133923 | A1 | 6/2007 | Han |
| 2007/0281394 | A1 | 12/2007 | Kawabe et al. |
| 2007/0290784 | A1 | 12/2007 | Nesse et al. |
| 2008/0007382 | A1 | 1/2008 | Snyder |
| 2008/0031286 | A1 | 2/2008 | Alfano et al. |
| 2008/0051158 | A1 | 2/2008 | Male et al. |
| 2008/0061631 | A1 | 3/2008 | Fouquet et al. |
| 2008/0174396 | A1 | 7/2008 | Choi et al. |
| 2008/0176362 | A1 | 7/2008 | Sengupta et al. |
| 2008/0179963 | A1 * | 7/2008 | Fouquet et al. ............... 307/104 |
| 2008/0180206 | A1 | 7/2008 | Fouquet et al. |
| 2008/0198904 | A1 | 8/2008 | Chang |
| 2008/0278255 | A1 * | 11/2008 | Harvey ............... 333/12 |
| 2008/0278275 | A1 | 11/2008 | Fouquet |
| 2008/0284552 | A1 | 11/2008 | Lim et al. |
| 2008/0308817 | A1 | 12/2008 | Wang et al. |
| 2008/0311862 | A1 | 12/2008 | Spina |
| 2009/0072819 | A1 | 3/2009 | Takahashi |
| 2009/0243782 | A1 * | 10/2009 | Fouquet et al. ............... 336/200 |
| 2009/0243783 | A1 | 10/2009 | Fouquet et al. |
| 2010/0020448 | A1 * | 1/2010 | Ng et al. ............... 361/1 |
| 2010/0052120 | A1 | 3/2010 | Pruitt |
| 2010/0118918 | A1 * | 5/2010 | Dupuis ............... 375/130 |
| 2010/0188182 | A1 | 7/2010 | Fouquet et al. |
| 2010/0259909 | A1 * | 10/2010 | Ho et al. ............... 361/767 |
| 2010/0328902 | A1 | 12/2010 | Ho et al. |
| 2011/0095620 | A1 * | 4/2011 | Fouquet et al. ............... 307/104 |

FOREIGN PATENT DOCUMENTS

| | | |
|---|---|---|
| CN | 1237081 | 12/1999 |
| DE | 19911133 | 10/2000 |
| DE | 10154906 | 5/2003 |
| EP | 1309033 | 5/2003 |
| EP | 1617337 | 1/2006 |
| GB | 2403072 | 6/2004 |
| JP | 57-39598 | 3/1982 |
| JP | 61-59714 | 3/1986 |
| JP | 3171705 | 7/1991 |
| JP | 06-53052 | 2/1994 |
| JP | 2000-508116 | 6/2000 |
| JP | 2003-151829 | 5/2003 |
| JP | 2005-513824 | 5/2005 |
| WO | WO-9734349 | 3/1997 |
| WO | WO-2005/001928 | 6/2005 |

OTHER PUBLICATIONS

High Speed Digital Isolators Using Microscale On-Chip Transformers, Baoxing chen, John Wynne, and Ronn Kliger, date unknown.

iCoupler R Digital Isolation Products, n/a. date unknown.

U.S. Appl. No. 11/264,956, filed Nov. 1, 2005, Guenin et al.

U.S. Appl. No. 11/512,034, filed Aug. 28, 2006, Fouquet et al.

U.S. Appl. No. 11/747,092, filed May 10, 2007, Fouquet et al.

"Advanced Circuit Materials, High Frequency Laminates and Flexible Circuit Materials", *Rogers Corporation*, <www.rogerscorporation.com/mwu/translations/prod.htm> Retreived Mar. 2008.

"Texas Instruments Dual Digital Isolators", *SLLS755E* Jul. 2007.

Allflex Flexible Printed Circuit, , "Design Guide", <www.allflexinc.com> Retrieved Feb. 12, 2009.

Analog Devices, Inc., "iCoupler Digital Isolator ADuM1100 Data Sheet,", *Rev F* 2006.

Avago Technologies, "ACCL-9xxx 3.3V/5V High Speed CMOS Capacitive Isolator", *Preliminary Datasheet*. 2005.

Chen, Baoxing, "iCoupler Products with iso Power Technology", "*Signal and Power Transfer Across Isolation Barrier Using Microtransformers*" *Analog Devices* 2006.

Electronic Design, "Planar Transformers make Maximum Use of Precious Board Space", *Penton Media, Inc., ED Online ID #7647* Mar. 9, 1998.

Kliger, R. , "Integrated Transformer-Coupled Isolation", Mar. 2003.

Krupka, J. et al., "Measurements of Permittivity, Loss Dielectric Tangent, and Resistivity of Float-Zone Silicon at Microwave Frequencies", *IEEE Abstract Microwave Theory and Techniques, IEEE Transaction on vol. 54, Issue 11* Nov. 2006 , 3995-4001.

Myers, John et al., "GMR Isolators", *Nonvalatile Electronics, Inc.* 1998.

Oljaca, Miroslav, "Interfacing the ADS1202 Modulator with a Pulse Transformer in Galvanically Isolated Systems", *SBAA096* Jun. 2003, 22 pages.

Payton Group International, "Off the Shelf SMT Planar Transformers", <http://www.paytongroup.com> Retrieved Mar. 31, 2008.

Yang, Ru-Yuan, "Loss Characteristics of Silicon Substrate with Different Resistivities", *Microwave and Optical Technology Letters*, vol. 48, No. 9 Sep. 2006.

\* cited by examiner

NARROWBODY COIL ISOLATOR

RELATED APPLICATIONS

This application claims priority and other benefits from, and is a continuation-in-part of, each of the following patent applications: (a) U.S. patent application Ser. No. 11/512,034 filed Aug. 28, 2006 entitled "Galvanic Isolator" to Fouquet et al. (hereafter "the '034 patent application"); (b) U.S. patent application Ser. No. 12/059,747 filed Mar. 31, 2008 entitled "Coil Transducer with Reduced Arcing and Improved High Voltage Breakdown Performance Characteristics" to Fouquet et al. (hereafter "the '747 patent application"); (c) U.S. patent application Ser. No. 12/059,979 filed Mar. 31, 2008 entitled "Galvanic Isolators and Coil Transducers" to Fouquet et al. (hereafter "the '979 patent application"); (d) U.S. patent application Ser. No. 12/370,208 filed Feb. 12, 2009 entitled "High Voltage Hold-off Coil Transducer" to Fouquet et al. (hereafter "the '208 patent application"); (e) U.S. patent application Ser. No. 12/392,978 filed Feb. 25, 2009 entitled "Miniature Transformers Adapted for Use in Galvanic Isolators and the Like" to Fouquet et al. (hereafter "the '978 patent application"); (f) U.S. patent application Ser. No. 12/393,596 filed Feb. 26, 2009 entitled "Minimizing Electromagnetic Interference in Coil Transducers" to Fouquet et al. (hereafter "the '596 patent application"); (g) U.S. patent application Ser. No. 12/477,078 filed Jun. 2, 2009 entitled "Galvanic Isolator" to Gek Yong Ng. et al. (hereafter "the '078 patent application"); and U.S. patent application Ser. No. 12/495,733 filed Jun. 30, 2009 entitled "Coil Transducer Isolator Packages" (hereafter "the '733 patent application"). This application also hereby incorporates by reference herein in their respective entireties the foregoing '034, '747, '979, '208, '978, '596, '078 and '733 patent applications.

This application also hereby incorporates by reference herein U.S. patent application Ser. No. 12/752,019 filed on even date herewith entitled "Widebody Coil Isolators" to Ho et al. (hereafter "the Ho patent application").

FIELD OF THE INVENTION

Various embodiments of the invention described herein relate to the field of data signal and power transformers or galvanic isolators and coil transducers, and more particularly to devices employing inductively coupled coil transducers to transmit and receive data and/or power signals across a dielectric or isolation barrier.

BACKGROUND

High voltage isolation communication devices known in the prior art include optical devices, magnetic devices and capacitive devices. Prior art optical devices typically achieve high voltage isolation by employing LEDs and corresponding photodiodes to transmit and receive light signals, usually require high power levels, and suffer from operational and design constraints when multiple communication channels are required.

Prior art magnetic devices typically achieve high voltage isolation by employing opposing inductively-coupled coils, usually require high power levels (especially when high data rates are required), typically require the use of at least three separate integrated circuits or chips, and often are susceptible to electromagnetic interference ("EMI").

Prior art capacitive devices achieve voltage isolation by employing multiple pairs of transmitting and receiving electrodes, where for example a first pair of electrodes is employed to transmit and receive data, and a second pair of electrodes is employed to refresh or maintain the transmitted signals. Such capacitive devices typically exhibit poor high voltage hold-off or breakdown characteristics The design of small high speed galvanic isolators or coil transducers presents several formidable technical challenges, such difficulty in miniaturizing such devices while keeping manufacturing costs low, maintaining high voltage breakdown characteristics, and providing acceptable data or power transfer rates.

SUMMARY

In one embodiment, there is provided a coil isolator comprising a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils, and at least first and second lead frames, wherein the coil transducer extends horizontally between the first and second lead frames and the first and second ends extend onto or beneath at least portions of the first and second lead frames, no portions of the first and second lead frames are disposed vertically over or beneath any portions of the first and second coils, and the wire bond pads of the first and second coils are disposed vertically over or beneath the first and second lead frames, respectively.

In another embodiment, there is provided a method of making a coil isolator comprising forming a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils, providing at least first and second lead frames, and attaching the coil transducer to the first and second lead frames such that the coil transducer extends horizontally between the first and second lead frames and the first and second ends extend onto or beneath at least portions of the first and second lead frames, no portions of the first and second lead frames are disposed vertically over or beneath any portions of the first and second coils, and the wire bond pads of the first and second coils are disposed vertically over or beneath the first and second lead frames, respectively.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTIONS OF SOME PREFERRED EMBODIMENTS

Figure 1:
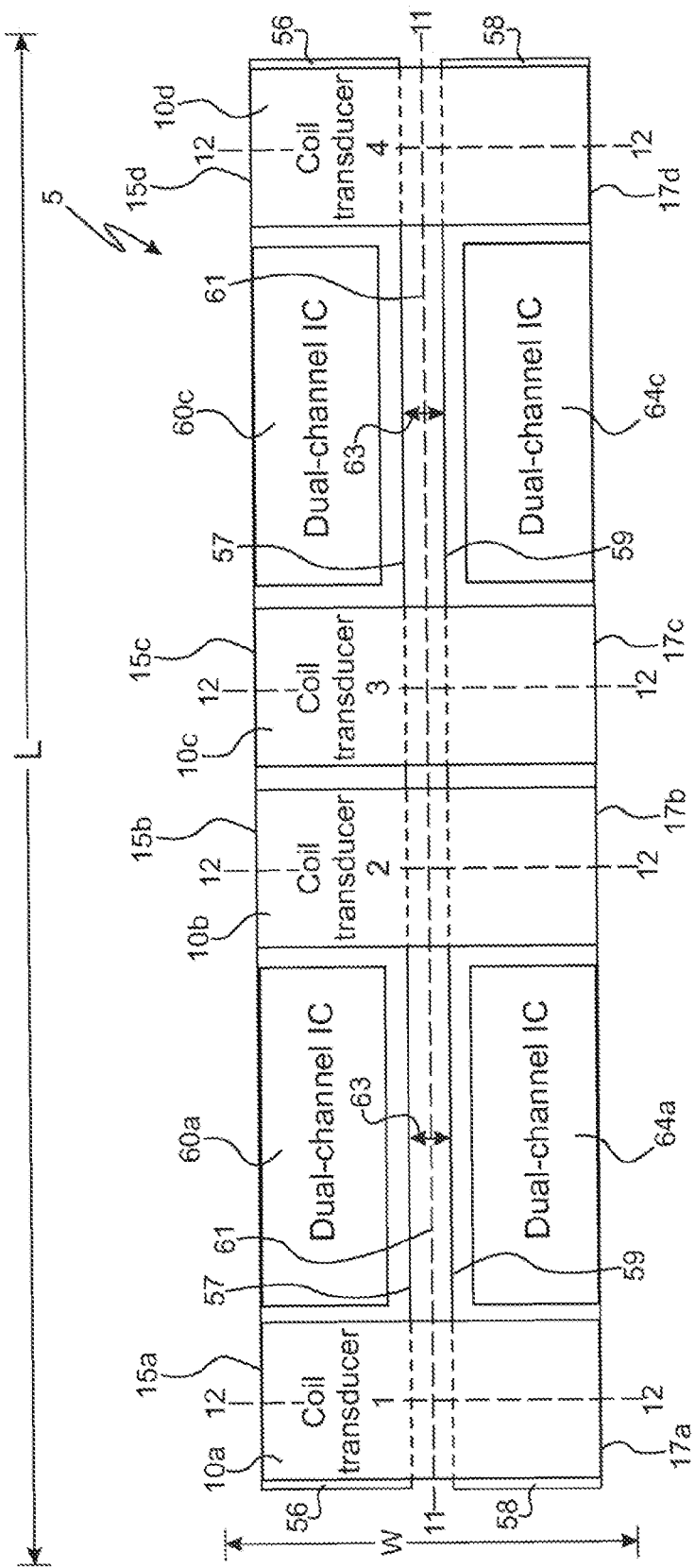
FIG. 1 shows a top plan view of one embodiment of a quad narrowbody coil isolator.

In the following description, specific details are provided to impart a thorough understanding of the various embodiments of the invention. Upon having read and understood the specification, claims and drawings hereof, however, those skilled in the art will understand that some embodiments of the invention may be practiced without hewing to some of the specific details set forth herein. Moreover, to avoid obscuring the invention, some well known circuits, materials and methods finding application in the various embodiments of the invention are not disclosed in detail herein.

In the drawings, some, but not all, possible embodiments of the invention are illustrated, and further may not be shown to scale.

The term "horizontal" as used herein means a plane substantially parallel to the conventional plane or surface of the dielectric barrier and substrate disclosed herein, regardless of its actual orientation in space. The term "vertical" refers to a direction substantially perpendicular to the horizontal as defined above. Terms such as "on,", "above," "below," "bottom," "top," "side," "sidewall," "higher," "lower," "upper," "over" and "under" are defined in respect of the horizontal plane discussed above.

Galvanic isolators based on coil transducers having multiple metal layers fabricated on insulating substrates offer the advantages of high efficiency, high speed and low cost. To keep costs low, it is desirable to fabricate the coil transducers using relatively inexpensive production techniques with wide traces and wide spaces between the traces. Coil transducers resulting from such an approach can be relatively large, however, which can cause difficulty when fitting multiple isolators based on this technology into a compact package. One solution is to stack different elements in the package on top of each other in the vertical direction, such as described in the co-pending '733 patent application. While the '733 patent application describes a number of viable approaches, packaging would be simpler and less expensive if the elements of the package did not have to be stacked on top of each other (aside from the lead frame; traditionally the circuit elements are attached to the top of the lead frame).

In many semiconductor chip packages, part of a metal lead frame (typically the ground lead) widens within the package to provide a plane upon which other elements, such as silicon chips, may sit. Described and disclosed herein are various embodiments of a narrowbody package that can accommodate four full coil transducer isolators in a configuration that does not require stacking aside from the lead frame. The various embodiments of quad narrowbody packages disclosed herein can operate with low enough crosstalk between adjacent channels that data streams are not corrupted. The disclosed coil transducers are bidirectional and provide a high degree of functionality at a low price.

A signal isolator typically includes a transmitter, a coil transducer and a receiver. The transmitter conditions the incoming signal so that it will drive the transducer effectively. The coil transducer transmits the signal from one side of an isolation barrier to the other side. The receiver turns the signal from the far side of the isolation barrier into a (usually digital) signal replicating the input signal. For the isolator to consume the smallest amount of power, it is desirable for the coil transducer to transmit the signal from one side of the isolation barrier to the other side with high efficiency. However, the mutual inductance between two similar coils generally decreases with decreasing coil diameter. Therefore, careful attention must be paid to the design of the coil transducer in order to obtain high efficiency in a narrowbody package. The isolator must also hold off large DC and transient voltages between the circuits on the two sides. See, for example, the foregoing '034, '747, '979, '208, '978, '596, '078, '733 and Ho patent applications.

A narrowbody package is not large, and much of the space available within the package must be used for parts and purposes other than the coil transducers contained therein. For example, the silicon transmitter and receiver consume a large fraction of the available "footprint", even if two channels are combined per chip (so that, for example, one chip may contain the transmitters for two channels and another chip may contain the receivers for two channels), as illustrated in some examples described and disclosed below. Allowances must be made for imprecise placement of parts within the package. Allowances may also be made for "squishout" of epoxy, if epoxy is used to attach the die within the package. Allowances must further be made for the molding material surrounding the other elements within the package, so that the molding material will cover the elements within the package and prevent high voltage breakdown or other problems associated with interaction with the external environment.

As a result, the portion of the "footprint" remaining in the package for the coil transducers may be rather small. To avoid low efficiency from a too-small coil transducer, it is important to keep both the silicon chip sizes and the allowances for packaging small. High-accuracy die placement techniques can reduce allowances for imprecise placement. Using an adhesive tape rather than epoxy to fix elements within the package can be advantageous because the tape eliminates the need for epoxy "squishout" allowances, therefore enlarging the space available for coil transducers within the package. Such an approach is relatively straightforward to employ for coil transducers. An adhesive tape approach may also be employed to attach silicon chips to a lead frame as well, so long as requirements for heatsinking and possible electrical conduction from the bottom of the chip to the lead frames can be met.

Figure 2:
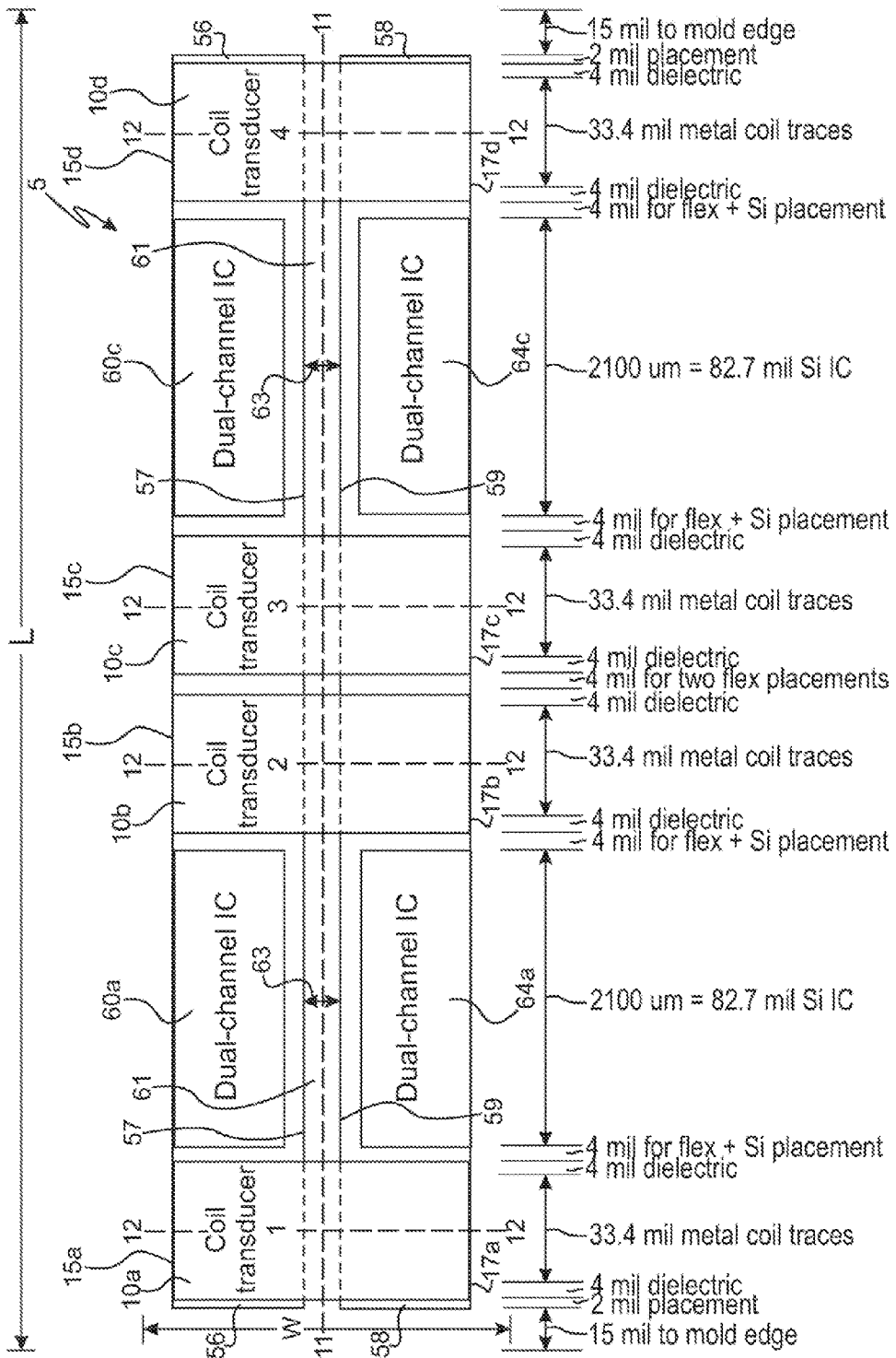
FIG. 2 shows a top plan view of the coil isolator of FIG. 1 with additional component spacing and other annotations.

FIG. 1 illustrates one embodiment of a layout for coil isolator 5 comprising magnetic coil transducers 10a, 10b, 10c and 10d. FIG. 2 applies some representative dimensions to the layout of FIG. 1, showing the space left for metal coil transducer traces. The layouts of FIGS. 1 and 2 assume that the flex and silicon parts are attached in such a way, e.g., using adhesive tape, that full allowances for epoxy squishout are not required.

Figure 3:
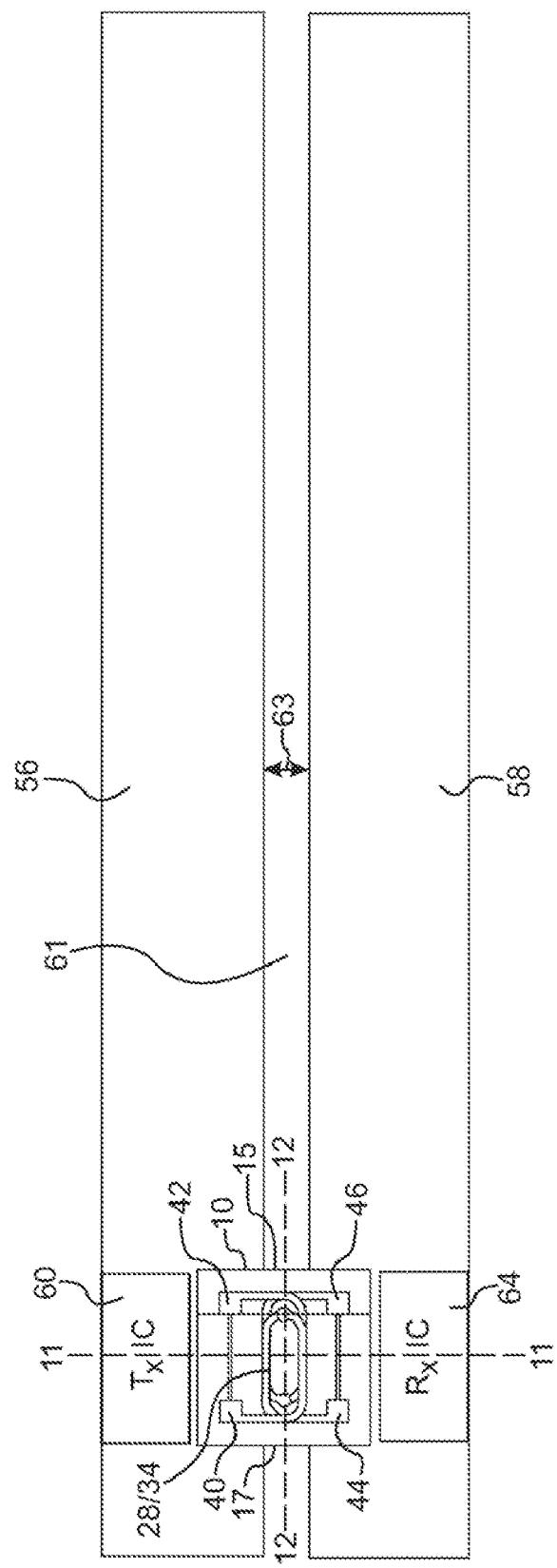
FIG. 3 shows a top plan view of another embodiment of a coil isolator.
Figure 4:
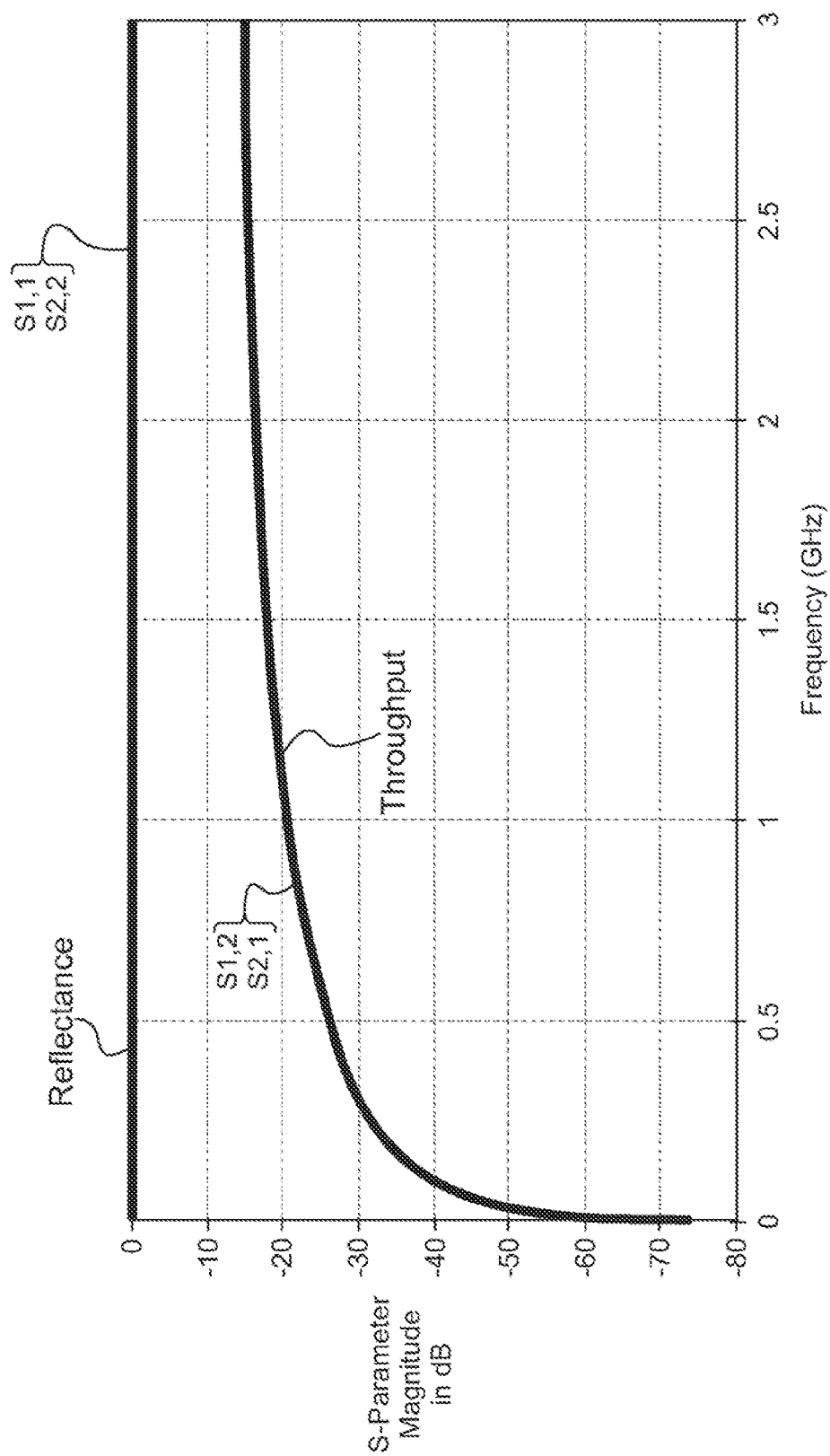
FIG. 4 shows S-parameter modeling results corresponding to the coil isolator of FIG. 3.

It has been discovered that a metal lead frame located directly underneath or over a coil transducer can significantly reduce signal transmission through the coil transducer. It is also desirable, however, to position the wirebond pads of a coil transducer directly over the lead frame for ease of wirebonding. According to one embodiment, a typical spacing 63 between input and output lead frames 56 and 58 in coil isolator 5 is about 8 mils (although other widths of such a gap are contemplated, such as 6 mils and 10 mils). Therefore, one might create a coil transducer to fit in such a space that looks like that shown in FIG. 3, in which the input and output coils 28 and 34 in coil transducer 10 fit within an 8 mil space between lead frames 56 and 58. Such a coil isolator would perform poorly, however. Full three-dimensional electromagnetic simulations using the software Microwave Studio™ from Computer Simulation Technology™ (CST) indicate that the throughput provided by the configuration of FIG. 3 would not exceed −15 dB up to 3 GHz, as shown in FIG. 4. Furthermore the peak frequency lies above 3 GHz, which is much higher than ideal; the silicon circuitry typically used for this application works much better with a peak frequency around the 250-500 MHz range. Unfortunately, the throughput of isolator 5 shown in FIG. 3 is less than −25 dB over such a frequency range. Consequently, a better design for coil isolator 10 is required.

Figure 5:
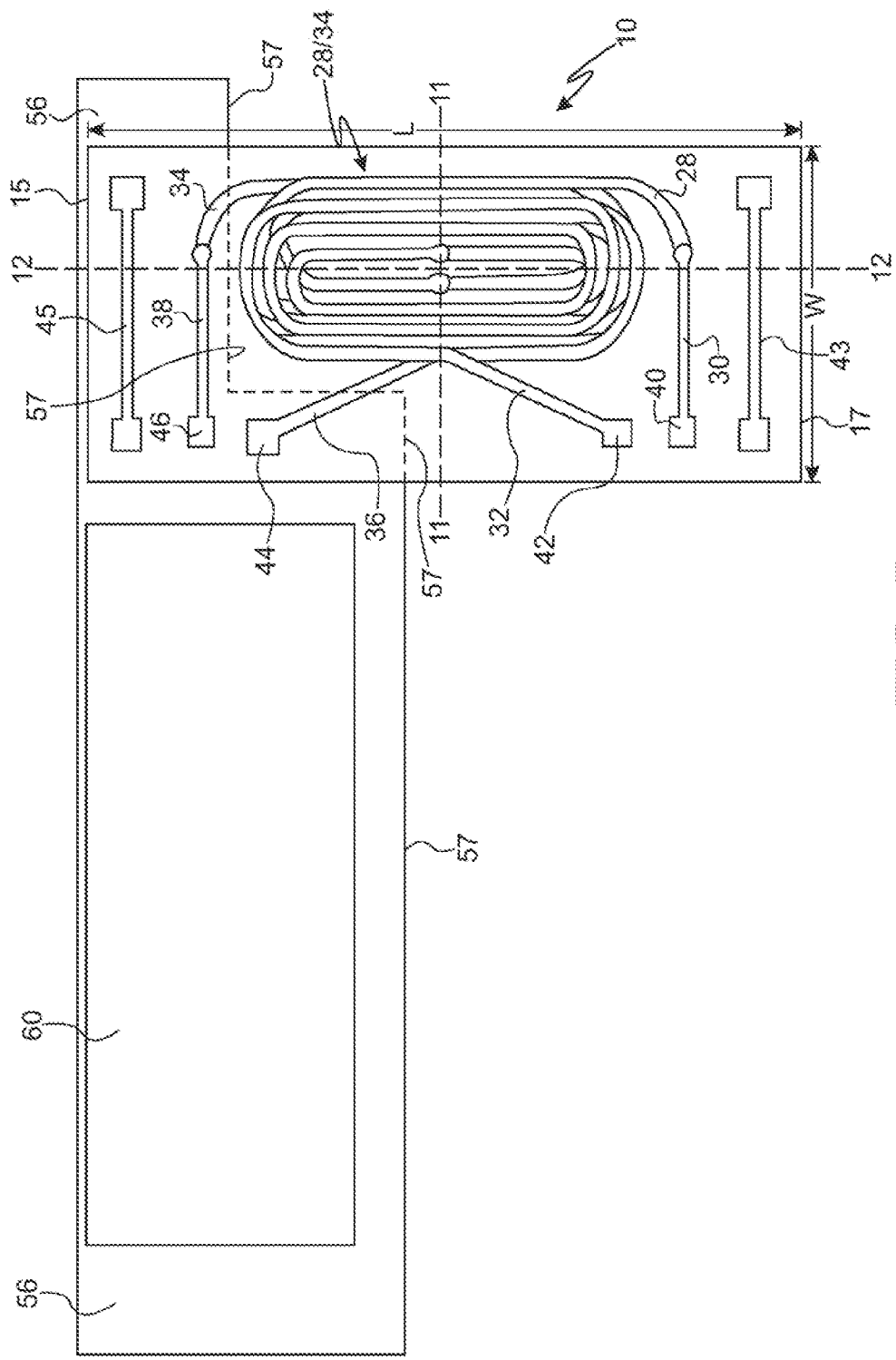
FIG. 5 shows a top plan view of a portion of yet another embodiment of a coil isolator.

Providing recesses in lead frames 56 and 58 to increase spacing between input and output sides 57 and 59 allows more space for coil turns. FIG. 5 illustrates how input lead frame 56 can be formed so that lead frame 56 mechanically supports wirebond pads 40 and 42 for good wirebonding, but is recessed towards the long edge of the package or coil isolator in the vicinity of coil transducer 10, thereby providing a much larger footprint for coil transducer 10. Note that the metal coil turns in coil transducer 10 shown in FIG. 5 do not occupy the full footprint of the flex substrate into which coils 28 and 34, wirebond pads 40 and 42, and bus trace 43 are formed. (Note further that coil transducer 10 may be formed of materials other than flex.) Bus leads 43 and 45 run along the outer edges to deliver a supply voltage, a ground signal or a control signal to a relatively distant silicon IC. (Additional bus leads may run at different flex levels, but some space for via pads, bondpads and bond wires must be provided in coil transducer 10.)

According to one embodiment, a four mil or 100 micron minimum distance is maintained between the metal traces and the edge of coil transducer 10 to seal the metal layers between the polyimide layers which are preferably employed to form the substrate of coil transducer 10; otherwise delamination could cause high voltage breakdown around the edges of the transducers. In addition, wirebond pads 40 and 42 are spaced away from coils 28 and 34 to provide room to fabricate a hole in an upper polyimide material to allow access to the bond pads for the lower metal coil layers.

Aside from the limitations listed above, coil transducer 10 of FIG. 5 has been designed to obtain adequately high signal transmission efficiency while maintaining high reliability. The tradeoff between efficiency and reliability comes largely through the choice of trace width and space width for coils 28 and 34. Flex fabricators may offer trace widths down to 1 mil or 25 microns wide, or even narrower, but the narrower the trace width, the more likely breakage during thermal cycling becomes due to differing coefficients of thermal expansion of the copper traces and the flex substrate, as well as problems arising from Ni/Au bond pad plating processes. On the other hand, narrower traces allow more coil turns in a given area. Increasing the number of coil turns increases the efficiency of signal transmission of coil transducer 10.

Figure 6:
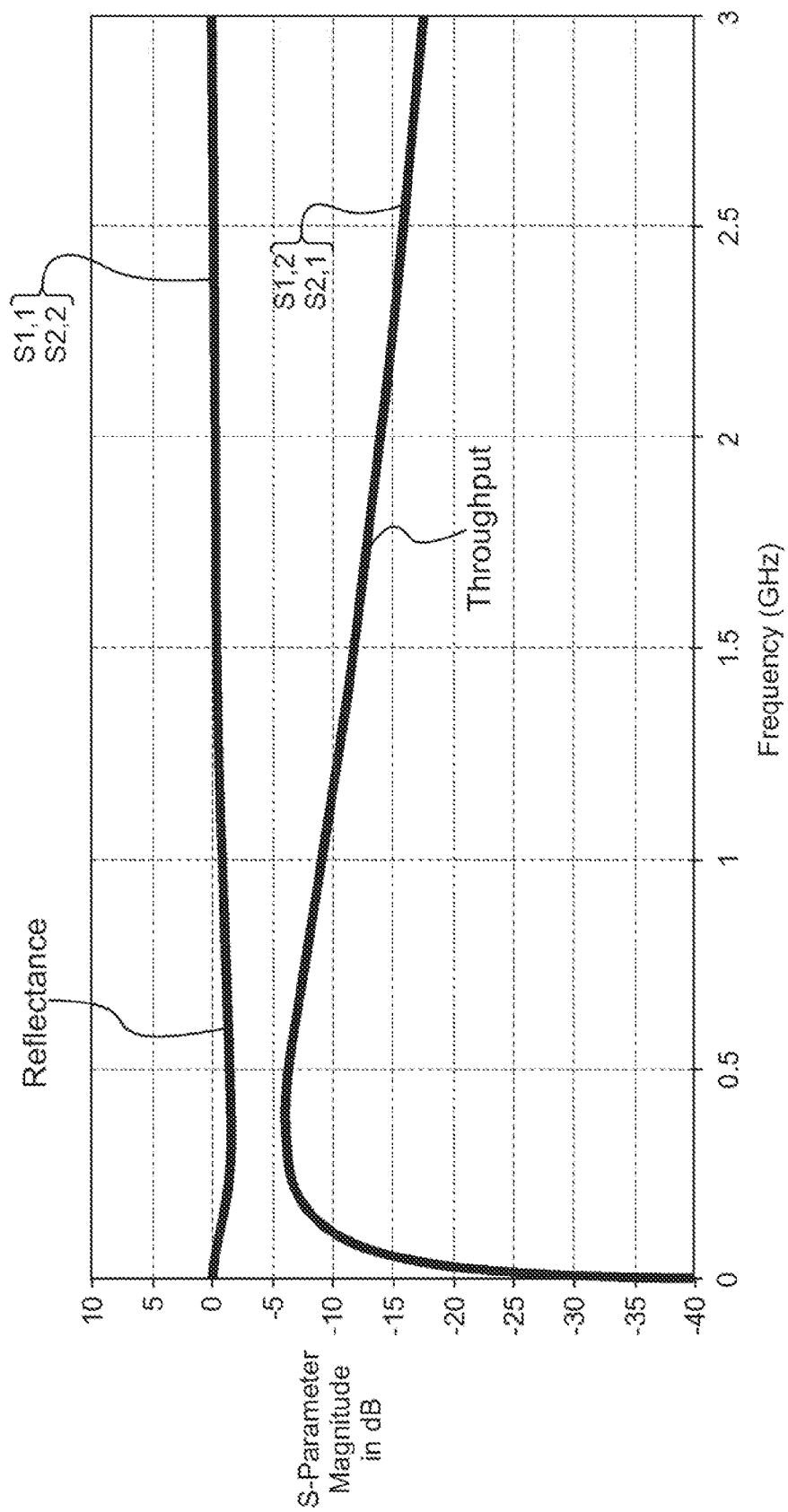
FIG. 6 shows S-parameter modeling results corresponding to the coil isolator of FIG. 5.
Figure 7:
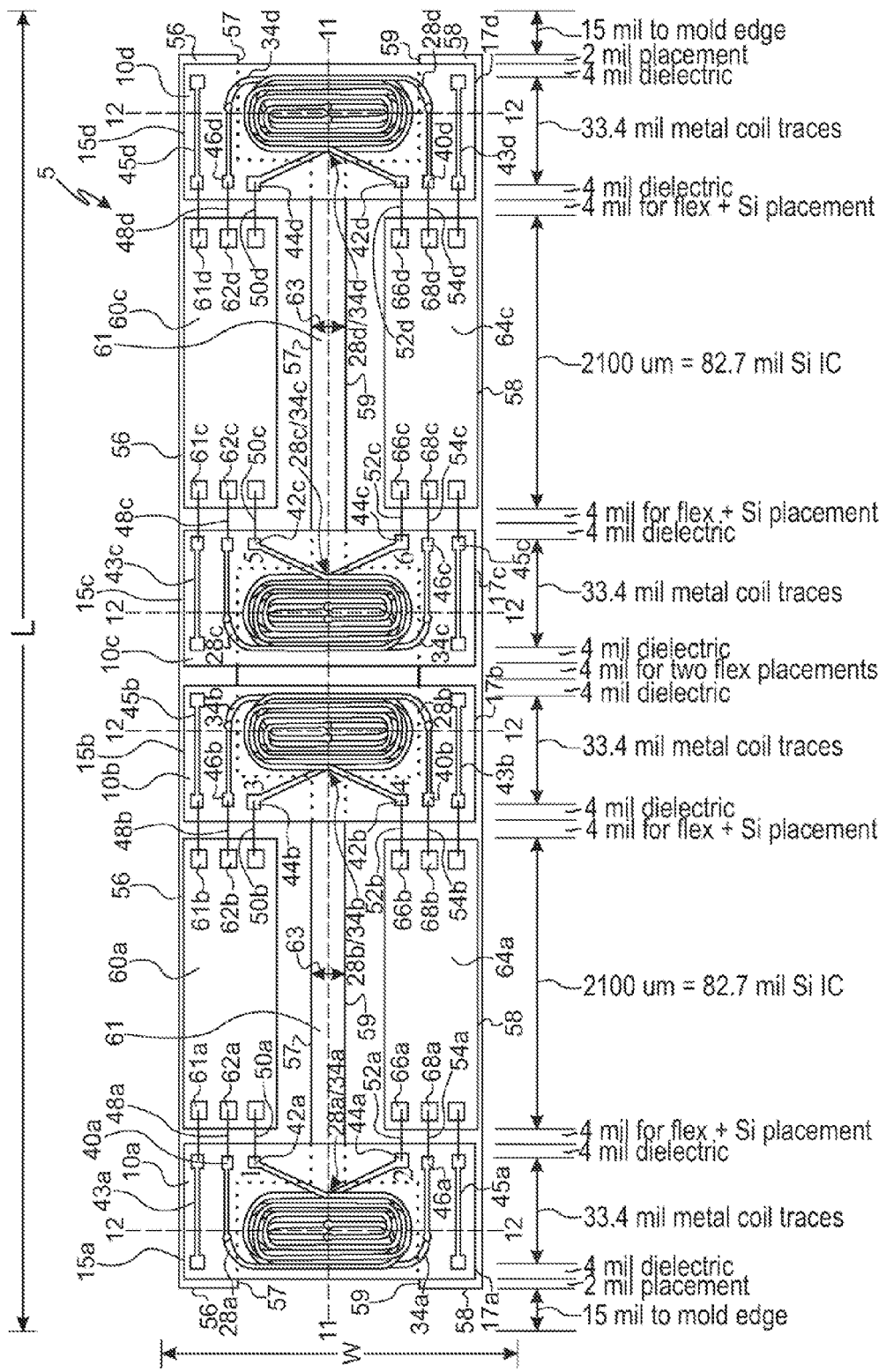
FIG. 7 shows a top plan view of still another embodiment of a quad narrowbody coil isolator.
Figure 8:
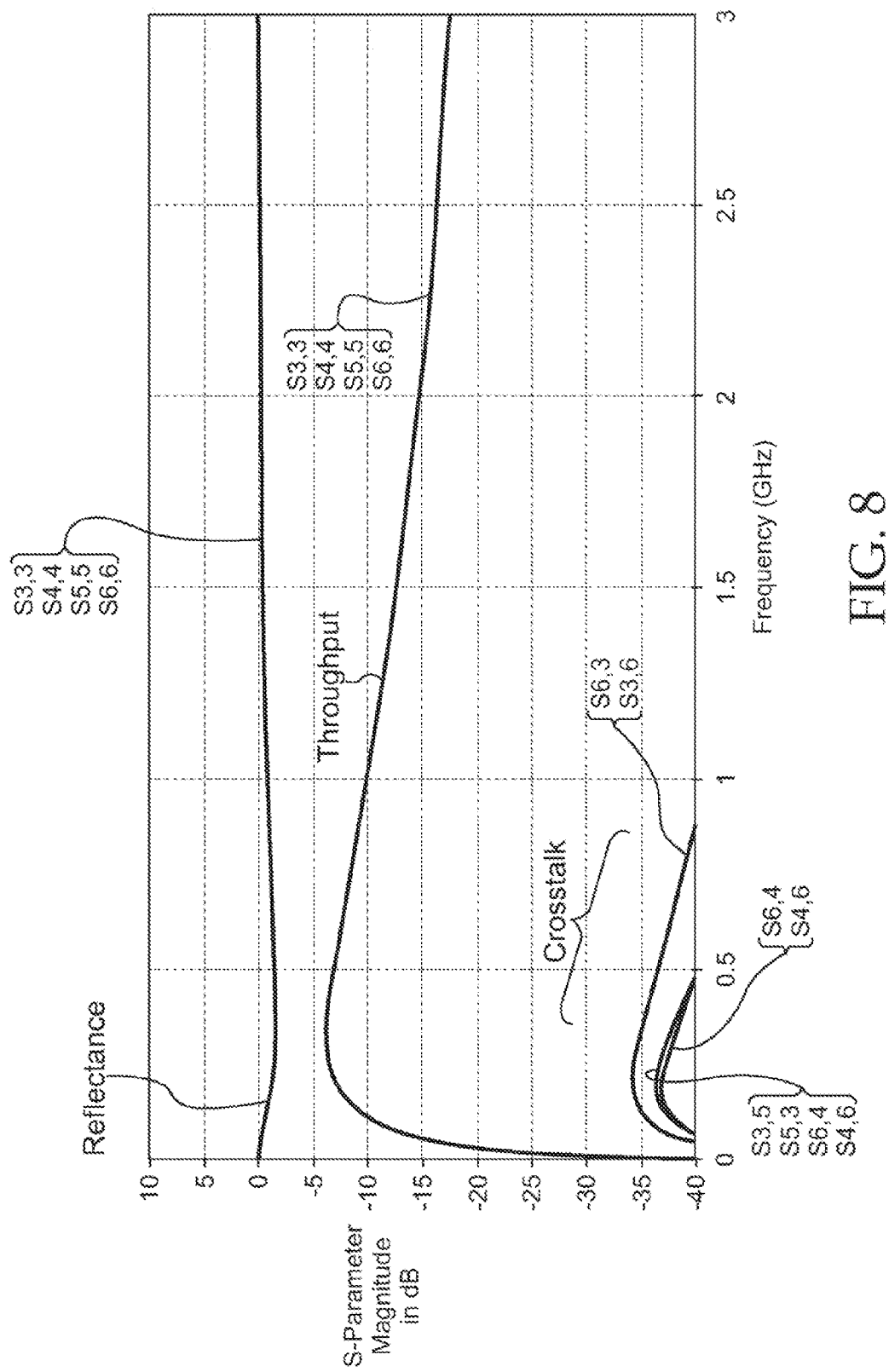
FIG. 8 shows S-parameter modeling results corresponding to the coil isolator of FIG. 7.

Coil transducer 10 shown in FIG. 5 contains 35 micron-wide traces and spaces and exhibits the S-parameter behavior (calculated using CST Microwave Studio) shown in FIG. 6. Here the peak throughput, at approximately −6 dB, is much higher than shown in FIG. 4 and provides good isolator functionality. The frequency of the peak signal is near 360 MHz, which is better for transmitter and receiver design than the peak frequency of over 3 GHz shown in FIG. 4. A full quad narrowbody package design of coil isolator 5 containing the coil transducer design of FIG. 5 is shown in FIG. 7. S-parameter behavior for the quad isolator package of FIG. 7 is shown in FIG. 8, where the peak signal is approximately 0.6 dB weaker and appears at a slightly lower frequency, largely due to the low frequency response of the bond wires attaching the coil transducers to the silicon chips. Package layout is preferably configured to keep bond wires as short as possible to minimize this effect.

Crosstalk peaking at approximately −34 dB in FIG. 8 represents an interaction between the two central coil transducers, 10b and 10c, which are the closest pair among coil transducers 10a, 10b, 10c and 10d. This interaction should be sufficiently weak to avoid introducing signal transmission errors. Interactions between a central coil transducer and the nearest outer coil transducer is much weaker due to the larger separation (on opposite sides of a silicon chip). This value has been calculated separately to be approximately −70 dB, which is so small that it is not a concern.

Figure 9:
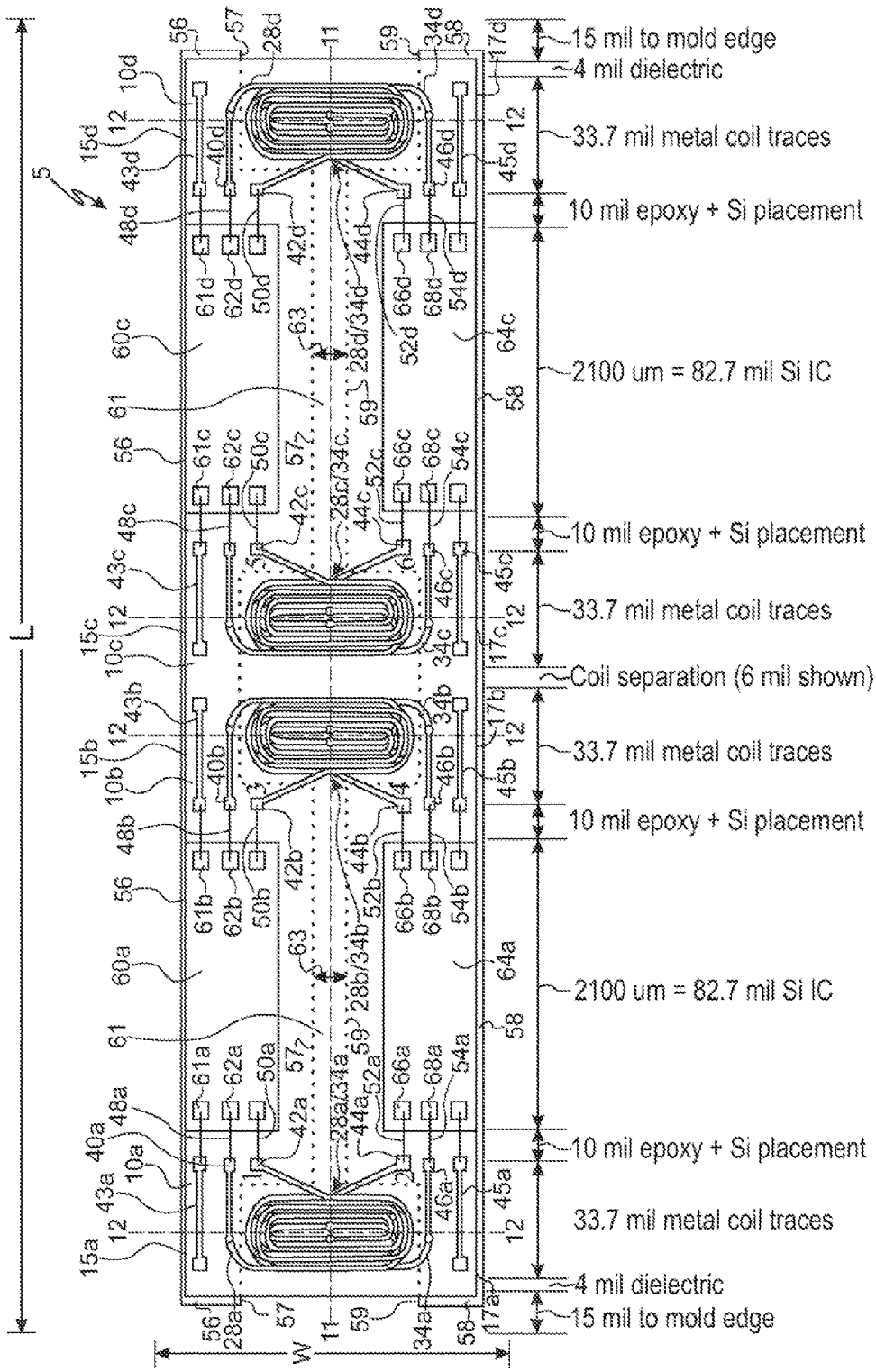
FIG. 9 shows a top plan view of a still further embodiment of a quad narrowbody coil isolator.

Rather than fabricating four separate flex transducers 10a, 10b, 10c and 10d to fit in a narrowbody package or coil isolator 5, it is also possible to fabricate one flex circuit containing four coil transducers. Such a design is shown in FIG. 9. Because all the transducers 10a, 10b, 10c and 10d are fabricated and built together, less space is consumed by edge allowances, placement errors and epoxy squishout, and thus the two central coil transducers 10b and 10c can be placed closer together. To prevent high voltage breakdown between the two central coils 10b and 10c, however, it is advisable to reverse the layout of one of this pair of centrally-located transducers (here the even-numbered transducers have been reversed) so that the coils connected to the input side of the isolator all sit on the same level of the flex circuit. This closer spacing allows a larger footprint for each coil transducer.

Figure 10:
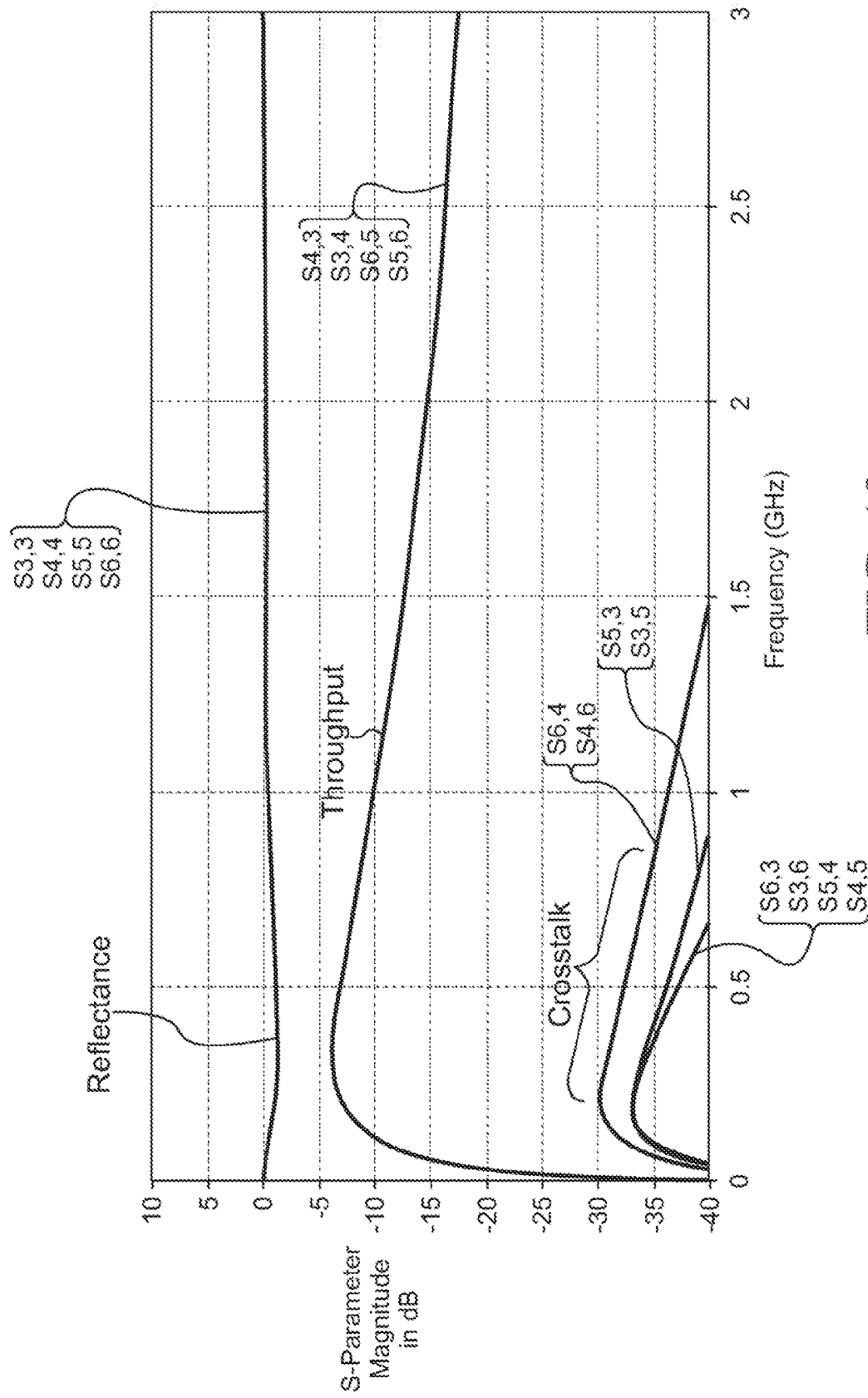
FIG. 10 shows S-parameter modeling results corresponding to the coil isolator of FIG. 9.

CST-calculated throughput for the slightly-enlarged coil transducer design of FIG. 9 is shown in FIG. 10. In the design of FIG. 9, 200 microns separates the two central coil transducers 10b and 10c to bring crosstalk below −30 dB. The increase in coil size is so small, however, that the change in throughput is minor. Additional considerations may prove more important than the small difference in throughput between the two cases when choosing between a single flex part containing four coil transducers and four single coil transducers.

In comparison to a single flex quad package or coil isolator, a package employing four single flex transducers uses less flex real estate, has more parts to handle, features increased separation between central channel coils, may require more expensive 25 mil traces (which are more likely to break), silicon chips are mounted on a lead frame and therefore have good heatsinking, all bond pads are at similar heights, supply voltages are run through silicon chips, supply voltage routing requires several (~8) wire bonds, there is plenty of surrounding field for mold penetration during package formation, it is difficult to add options because one "bus" is formed in silicon, and there is a higher chance of high voltage breakdown at the center of the package.

In comparison to a four single flex transducer package or coil isolator, a single flex quad package uses about 2.5 times more flex real estate, has fewer parts to handle, requires less space between central coil transducer traces, can use less expensive 35 mil traces, the silicon chips sit on flex so heat-sinking is not as good, the tops of the silicon chip bond pads are higher, voltage supply routing can run through the flex material, voltage supply routing depends on fewer (~4) wire bonds, package molding connects the top and bottom of the package only at the edges, multiple buses can carry ground, supply, and other connections, and high voltage breakdown is very unlikely to occur in the center coil transducers.

Referring now to FIGS. 1, 2, 5, 7 and 9, coil isolators 5 will each be seen to comprise coil transducers 10a, 10b, 10c and 10d, where each coil transducer has opposing first and second ends 15a through 15d, and 17a through 17d. Each of coil transducers 10a, 10b, 10c and 10d comprises a dielectric barrier having opposing first and second sides, where the dielectric barrier comprises an electrically insulating, non-metallic, non-semiconductor, low-dielectric-loss material such as polyimide or KAPTON. First electrically conductive coils 28a-28d are disposed near or on first sides 24a-24d of dielectric barriers 22a-22d of each coil transducer, first leads 30a-30d and 32a-32d extending between first coils 28a-28d and wire bond pads corresponding thereto (40a-40d and 42a-42d). Second electrically conductive coils 34a-34d are disposed near or on second sides 26a-26d of dielectric barriers 22a-22d of each coil transducer, second leads 36a-36d and 38a-38d extending between second coils 34a-34d and wire bond pads corresponding thereto (44a-44d and 46a-46d), where dielectric barriers 22a-22d are disposed between first and second coils 28a-28d and 34a-34d. First and second lead frames 56 and 58 are located near one another but are separated by gap 63, where input lead frame edge 57 faces output lead frame edge 59 across gap 63. In whichever configuration they are employed, first and second lead frames 56 and 58 cannot touch one another, and must be electrically isolated from one another, to prevent shorting therebetween. Each of coil transducers 10a, 10b, 10c and 10d extends horizontally between first and second lead frames 56 and 58 such that the first and second ends 15a-15d and 17a-17d thereof extend onto or beneath at least portions of first and second lead frames 56 and 58, and further such that no portions of first and second lead frames 56 and 58 are disposed vertically over or beneath any portions of first and second coils 28 and 34, and also such that wire bond pads 40a-40d, 42a-42d, 44a-44d, and 46a-46d of first and second coils 28a/34a-28d/34d are disposed vertically over or beneath first and second lead frames 56 and 58, respectively. See the Ho patent application for some details concerning barriers 22a-22d, sides 24a-24d, and sides 26a-26d.

As noted above, in one embodiment each coil transducer is formed of a flex circuit material, although other materials such as ceramic, silicon, printed circuit boards and other materials and processes known to those skilled in the art may also be employed.

As shown in FIGS. 1, 2, 7 and 9, ICs 60a-60d and 64a-64d comprise transmitter and receiver terminals that are operably connected to coil transducers 10a-10d through wire bond pads 40a-40d, 42a-42d, 44a-44d and 46a-46d corresponding thereto. Such ICs 60a-60d and 64a-64d may be configured to provide differential signals across first coils 28a-28d or second coils 34a-34d. Transmitter and receiver functions can be assigned to appropriate channels in the transmitter and receiver ICs, respectively, as required.

Note that first and second coils 28a-28d and 34a-34d may be spatially arranged and configured respecting one another such that at least one of power and data signals may be transmitted by each of first coils 28a-28d to each of second coils 34a-34d across their respective dielectric barriers.

Note further that each pair of first and second coils 28a/34a, 28b/34b, 28c/34c and 28d/34d may have, in combination, at least five turns, at least eight turns, at least ten turns, or at least twenty turns. In the examples shown in FIGS. 5, 7 and 9, each pair of first and second coils 28/34 has about 11.5 turns.

The dielectric barrier contained in each coil transducer may comprise one or more of fiberglass, glass, ceramic, polyimide, polyimide film, a polymer, an organic material, a flex circuit material, epoxy, epoxy resin, a printed circuit board material, PTFE and glass, PTFE and ceramic, glass and ceramic, thermoset plastic, and plastic.

A breakdown voltage between a first coil 28 and a second coil 34 may exceed about 2,000 volts RMS when applied over a time period of about one minute, exceed about 2,000 volts RMS when applied over a time period of about six minutes, exceed about 2,000 volts RMS when applied over a time period of 24 hours, exceed about 5,000 volts RMS when applied over a time period of about one minute, exceed about 5,000 volts RMS when applied over a time period of about six minutes, or exceed about 5,000 volts RMS when applied over a time period of 24 hours. The first and second coils 28 and 34 may comprise a metal, a metal alloy or a metal combination. Moreover, each of coil transducers 10a, 10b, 10c, and 10d and at least portions of the first and second lead frames 56 and 58 may be encapsulated with a molding material such a silica-loaded epoxy, which has been discovered to reduce thermal expansion mismatches.

Referring now to FIG. 5, a length L of coil transducer 10 between first and second ends 15 and 17 may be less than about 2.5 mm. A width W of coil transducer 10 may be less than about 1.5 mm.

Referring now to FIGS. 7 and 9, it will be seen that all wire bond pads 40a-40d, 42a-42d, 44a-44d and 46a-46d for coils 28a-28d and 34a-34d of coil transducers 10a, 10b, 10c and 10d, respectively, are located to one side of major axes 12 of coil transducers 10a, 10b, 10c and 10d. In other embodiments, wire bond pads for coils 28a-28d and 34a-34d of coil transducers 10a-10d may be located on both sides of major axes 12.

Continuing to refer to FIGS. 7 and 9, package 5 comprising four coil transducers 10a-10d, first and second lead frames 56 and 58, and transmitter and receiver circuits 60a-60d and 64a-64d may have a length L less than about 20 mm or 12 mm, and a width W less than about 10 mm, about 6 mm, or about 4 mm. Package 5 may also be configured such that transmitters 60a-60d and receivers 64a-64d are not stacked vertically over any portions of coil transducers 10a-10d.

A spacer layer may be disposed over the upper and lower surfaces of coil transducers 10a-10d, where the spacer layer comprises a low-dielectric-loss material, and is configured to minimize the electrical interaction between at least some electrically conductive portions of coil transducers 10a-10d and nearby electrical conductors or traces located outside the coil transducer. Such a spacer layer may have a thickness ranging between about 25 microns and about 50 microns.

According to some embodiments, the coil transducers are bidirectional, and therefore transmitter/receiver pairs may be spatially arranged and configured within the isolator or package as required. For example, the coil transducers in the isolator may be configured such that data travel from left to right in all four channels, or from left to right in two channels and right to left in the other two channels. The transmitter and receiver sides of coil isolator 5 can also be reversed, the elements in any transmitter/receiver pair can be reversed, and each metal pad or lead frame can be held at its local supply voltage rather than at ground potential.

Note that included within the scope of the present invention are methods of making and having made, and using, the various components, devices and systems of the coil isolators described herein, such as some of the methods described above.

The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A coil isolator, comprising:
a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils, and
at least first and second lead frames;
wherein the coil transducer extends horizontally between the first and second lead frames and the first and second ends extend onto or beneath at least portions of the first and second lead frames, no portions of the first and second lead frames are disposed vertically over or beneath any portions of the first and second coils, and the wire bond pads of the first and second coils are disposed vertically over or beneath the first and second lead frames, respectively.

2. The coil isolator of claim 1, wherein the coil transducer is a flex circuit.

3. The coil isolator of claim 1, further comprising a transmitter circuit comprising transmitter output terminals, the transmitter output terminals being operably connected to the first coil through the wire bond pads corresponding thereto.

4. The coil isolator of claim 3, wherein the transmitter circuit is configured to provide differential output signals across the first coil.

5. The coil isolator of claim 1, further comprising a receiver circuit comprising receiver input terminals, the receiver input terminals being operably connected to the second coil through the wire bond pads corresponding thereto.

6. The coil isolator of claim 5, wherein the receiver circuit is configured to receive differential input signals.

7. The coil isolator of claim 6, wherein the receiver circuit is an integrated circuit.

8. The coil isolator of claim 1, wherein the first and second coils are spatially arranged and configured respecting one another such that at least one of power and data signals may be transmitted by the first coil to the second coil across the dielectric barrier.

9. The coil isolator of claim 1, wherein the first and second coils have, in combination, at least five turns, at least eight turns, at least ten turns, or at least twenty turns.

10. The coil isolator of claim 1, wherein the dielectric barrier comprises fiberglass, glass, ceramic, polyimide, polyimide film, a polymer, an organic material, a flex circuit material, epoxy, epoxy resin, a printed circuit board material, PTFE and glass, PTFE and ceramic, glass and ceramic, thermoset plastic, or plastic.

11. The coil isolator of claim 1, wherein a breakdown voltage between the first coil and the second coil exceeds about 2,000 volts RMS when applied over a time period of about one minute, exceeds about 2,000 volts RMS when applied over a time period of about six minutes, exceeds about 2,000 volts RMS when applied over a time period of 24 hours, exceeds about 5,000 volts RMS when applied over a time period of about one minute, exceeds about 5,000 volts RMS when applied over a time period of about six minutes, or exceeds about 5,000 volts RMS when applied over a time period of 24 hours.

12. The coil isolator of claim 1, wherein the coil transducer further comprises internal voltage supply routing.

13. The coil isolator of claim 1, wherein the coil transducer further comprises ground routing or one or more ground pads.

14. The coil isolator of claim 1, wherein the first and second coils comprise a metal, a metal alloy or a metal combination.

15. The coil isolator of claim 1, wherein the coil transducer and at least portions of the first and second lead frames are encapsulated with a molding material comprising silica-loaded epoxy.

16. The coil isolator of claim 1, wherein a length of the coil transducer between the first and second ends is less than about 2.5 mm.

17. The coil isolator of claim 1, wherein a width of the coil transducer is less than about 1.5 mm.

18. The coil isolator of claim 1, wherein all wire bond pads for coils of the coil transducer are located to one side of a major axis of the coil transducer.

19. The coil isolator of claim 1, wherein wire bond pads for coils of the coil transducer are located on both sides of a major axis of the coil transducer.

20. The coil isolator of claim 1, further comprising a package comprising the coil transducer, the first and second lead frames, and transmitter and receiver circuits, the package having a length less than about 20 mm or less than about 12 mm.

21. The coil isolator of claim 1, further comprising a package comprising the coil transducer, the first and second lead frames, and transmitter and receiver circuits, the package having a width less than about 10 mm, less than about 6 mm, or less than about 4 mm.

22. The coil isolator of claim 1, further comprising a package wherein a transmitter and a receiver are not stacked vertically over any portions of the coil transducer.

23. The coil isolator of claim 1, further comprising a spacer layer disposed over the first or second sides of the coil transducer, the spacer layer comprising a low-dielectric-loss material.

24. The coil isolator of claim 23, wherein the spacer layer is configured to minimize the electrical interaction between at least some electrically conductive portions of the coil transducer and nearby electrical conductors or traces located outside the coil transducer.

25. The coil isolator of claim 23, wherein the spacer layer has a thickness ranging between about 25 microns and about 50 microns.

26. A method of making a coil isolator, comprising:
forming a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils;
providing at least first and second lead frames, and
attaching the coil transducer to the first and second lead frames such that the coil transducer extends horizontally between the first and second lead frames and the first and second ends extend onto or beneath at least portions of the first and second lead frames, no portions of the first and second lead frames are disposed vertically over or beneath any portions of the first and second coils, and the wire bond pads of the first and second coils are disposed vertically over or beneath the first and second lead frames, respectively.

27. The method of claim 26, further comprising operably connecting a transmitter circuit having output terminals to the wire bond pads corresponding to the first coil.

28. The method of claim 26, further comprising operably connecting a receiver circuit having input terminals to the wire bond pads corresponding to the second coil.

29. The method of claim 26, wherein forming the coil transducer further comprises forming at least five turns, at least eight turns, at least ten turns, or at least twenty turns, in combination, in the first and second coils.

30. The method of claim 26, wherein forming the coil transducer further comprises employing fiberglass, glass, ceramic, polyimide, polyimide film, a polymer, an organic material, a flex circuit material, epoxy, epoxy resin, a printed circuit board material, PTFE and glass, PTFE and ceramic, glass and ceramic, thermoset plastic, or plastic to form the dielectric barrier.

31. The method of claim 26, wherein forming the coil transducer further comprises forming internal voltage supply routing therein or thereon.

32. The method of claim 26, wherein forming the coil transducer further comprises forming ground routing or one or more ground pads therein or thereon.

33. The method of claim 26, further comprising encapsulating the coil transducer and at least portions of the first and second lead frames with a molding material comprising silica-loaded epoxy.

34. The method of claim 26, wherein forming the coil transducer further comprises configuring the coil transducer to have a length between the first and second ends of less than about 2.5 mm.

35. The method of claim 26, wherein forming the coil transducer further comprises configuring the coil transducer to have a width less than about 1.5 mm.

36. The method of claim 26, wherein forming the coil transducer further comprises placing all wire bond pads for coils of the coil transducer to one side of a major axis of the coil transducer.

37. The method of claim 26, wherein forming the coil transducer further comprises placing wire bond pads for coils of the coil transducer on both sides of a major axis of the coil transducer.

38. The method of claim 26, further comprising forming a package comprising the coil transducer, the first and second lead frames, and transmitter and receiver circuits, where the package has a length less than about 20 mm or less than about 12 mm.

39. The method of claim 26, further comprising forming a package comprising the coil transducer, the first and second lead frames, and transmitter and receiver circuits, where the package has a width less than about 10 mm or less than about 4 mm.

40. The method of claim 26, further comprising forming a package wherein a transmitter and a receiver are not stacked vertically over any portions of the coil transducer.

41. The method of claim 26, further comprising placing a spacer layer over the first or second sides of the coil transducer, the spacer layer comprising a low-dielectric-loss material.

* * * * *